(12) United States Patent
Zhang et al.

(10) Patent No.: US 11,018,111 B2
(45) Date of Patent: May 25, 2021

(54) WAFER LEVEL DERIVED FLIP CHIP PACKAGE

(71) Applicant: Texas Instruments Incorporated, Dallas, TX (US)

(72) Inventors: Rongwei Zhang, Plano, TX (US); James Huckabee, Sherman, TX (US); Vikas Gupta, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/423,104

(22) Filed: May 27, 2019

(65) Prior Publication Data

US 2020/0381390 A1 Dec. 3, 2020

(51) Int. Cl.
| | |
|---|---|
| *H01L 21/50* | (2006.01) |
| *H01L 23/00* | (2006.01) |
| *H01L 23/31* | (2006.01) |
| *H01L 23/495* | (2006.01) |
| *H01L 23/544* | (2006.01) |
| *H01L 21/304* | (2006.01) |
| *H01L 21/48* | (2006.01) |
| *H01L 21/56* | (2006.01) |
| *H01L 21/78* | (2006.01) |

(52) U.S. Cl.
CPC ............ *H01L 24/96* (2013.01); *H01L 21/304* (2013.01); *H01L 21/4825* (2013.01); *H01L 21/561* (2013.01); *H01L 21/565* (2013.01); *H01L 21/78* (2013.01); *H01L 23/3114* (2013.01); *H01L 23/4951* (2013.01); *H01L 23/49582* (2013.01); *H01L 23/544* (2013.01); *H01L 2223/5446* (2013.01)

(58) Field of Classification Search
CPC . H01L 21/304; H01L 21/4825; H01L 21/561; H01L 21/565; H01L 21/78; H01L 23/3114; H01L 23/4951; H01L 23/49582; H01L 23/544; H01L 24/96
USPC ......................................................... 438/123
See application file for complete search history.

(56) References Cited

U.S. PATENT DOCUMENTS

| | | | |
|---|---|---|---|
| 6,181,569 B1 * | 1/2001 | Chakravorty | ........ H05K 3/3436 361/761 |
| 6,590,281 B2 * | 7/2003 | Wu | ..................... H01L 23/3107 257/684 |
| 6,717,245 B1 * | 4/2004 | Kinsman | ............. H01L 23/3114 257/678 |
| 6,867,072 B1 | 3/2005 | Shiu et al. | |
| 8,169,058 B2 * | 5/2012 | Pagaila | ............. H01L 23/49575 257/629 |

(Continued)

*Primary Examiner* — Luan C Thai
(74) *Attorney, Agent, or Firm* — Ronald O. Neerings; Charles A. Brill; Frank D. Cimino

(57) ABSTRACT

A leadless integrated circuit (IC) package includes a spaced apart plurality of lead terminals on at least two sides of the leadless IC package, and an IC die including a substrate having at least a semiconductor surface including circuitry coupled to bond pads with the bond pads having bonding features thereon. The bonding features are flip chip bonded to the plurality of lead terminals. Mold compound is above the IC die and between adjacent lead terminals. The lead terminals and the substrate both extend out to have exposed surfaces at edges of the leadless IC package, and the lead terminals also provide a back side bondable contact.

20 Claims, 3 Drawing Sheets

(56) References Cited

U.S. PATENT DOCUMENTS 8,304,277 B2 * 11/2012 Pagaila ................ H01L 21/561
438/55
8,896,010 B2    11/2014 Tischler
9,892,916 B2 *  2/2018 Lim ...................... H01L 21/768

* cited by examiner

WAFER LEVEL DERIVED FLIP CHIP PACKAGE

FIELD

This Disclosure relates to leadless packaged semiconductor devices.

BACKGROUND

Leadframe semiconductor packages are well-known and widely used in the electronics industry to house, mount, and interconnect a variety of integrated circuits (ICs) that comprise semiconductor die. A conventional leadframe is typically die-stamped from a sheet of flat-stock metal, and includes a plurality of metal leads temporarily held together in a planar arrangement about a central region during package manufacturing by a rectangular frame comprising a plurality of expendable "dam-bars."

For conventional top side (active side) IC die up packages, a mounting pad for an IC die is typically supported in the central region by "tie-bars" that attach to the frame. The leads extend from a first end integral with the frame to an opposite second end adjacent to, but spaced apart from, the die pad. In a flip chip on lead package arrangement, an IC die having solder bumps on its bond pads is flipped onto leads of a leadframe.

Quad flat no lead (QFN)-type packages also provided certain mechanical advantages for high-speed circuits including improved co-planarity and heat dissipation. The small footprint of the QFN-type package, coupled with the low mounted height and relatively good protection moisture performance has quickly gained acceptance in the marketplace.

Conventional QFN packages (typical QFN, flip chip QFN and clip QFN packages) all need a leadframe for their packaging. Conventional flip chip QFN assembly is performed by bonding a single singulated semiconductor die onto a leadframe strip that has lead terminals on at least two sides, followed by wirebonding for a typical QFN package, then molding, and then sawing.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include a method to form leadless IC packages that does not utilize a leadframe by instead performing the assembly steps at the wafer level including the molding, printing of the lead terminals, and then sawing. There is thus no leadframe in disclosed methods because disclosed methods comprise all wafer level packaging including the printing of the lead terminals.

Disclosed leadless IC packages also inherently have exposed lead terminal side walls after the sawing, so that disclosed leadless IC packages also resolve the sidewall wettability issue during surface mount (SMT) processing of QFN packages typically to land pads on a printed circuit board (PCB). Conventional QFN packages need extra processing to form wettable flank dimples etched into the outer bottom edges of the lead terminals for this purpose which is known in the art as wettable flanks. For disclosed leadless IC packages, in the case of exposed copper lead terminals, metal plating can follow after wafer sawing. However, if the lead terminals comprise an oxidation resistant material such as silver, palladium, or gold, such as when one first prints copper ink and then prints silver ink, or the lead terminals are entirely an oxidation resistant material such as silver, then there is generally no need for plating.

Disclosed aspects include a leadless IC package that includes a spaced apart plurality of lead terminals on at least two sides of the leadless IC package, and an IC die including a substrate having at least a semiconductor surface including circuitry coupled to bond pads, with the bond pads having bonding features thereon. The bonding features are flip chip bonded to the plurality of lead terminals. Mold compound is above the IC die and between adjacent lead terminals. The lead terminals and the substrate both extend out to have exposed surfaces at edges of the leadless IC package, and the lead terminals also provide a back side bondable contact.

BRIEF DESCRIPTION OF THE DRAWINGS

Reference will now be made to the accompanying drawings, which are not necessarily drawn to scale, wherein:

FIG. 1A shows a wafer comprising a substrate having circuitry coupled to bond pads with bonding features thereon shown as pillars, the wafer comprising a plurality of IC die that are separated by scribe lines. FIG. 1B shows the wafer after forming a mold compound on both its top side and its bottom side. FIG. 1C shows the wafer after removing a portion of the mold compound to expose at least a top surface of the bonding features.

FIG. 1D shows the wafer after a printing metal precursor material then curing or sintering to form a solid in a pattern of lead terminal precursors that include connections between adjacent bonding features on opposite sides of the scribe lines. FIG. 1E shows a single device as a simplified leadless IC package formed after sawing over the scribe lines to cut through the lead terminal precursors to form lead terminals and to also saw through the mold compound and through the substrate to singulate the wafer into a plurality of the leadless IC packages that each include an IC die.

DETAILED DESCRIPTION

Figure 1A:
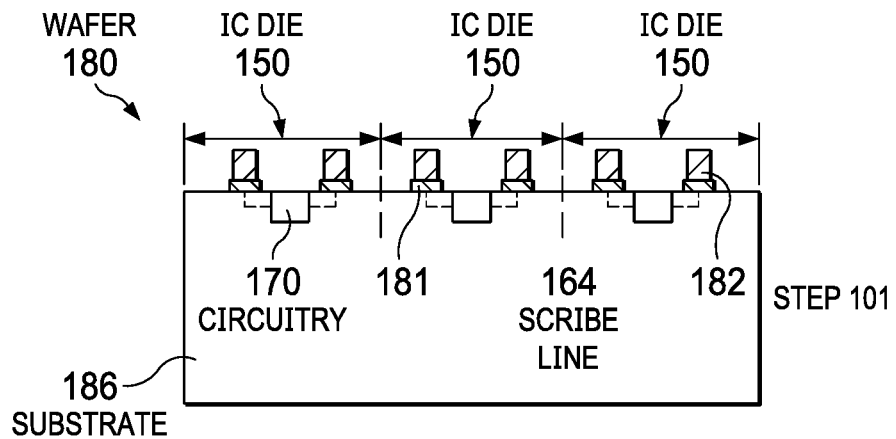
FIG. 1A-E show successive cross-sectional depictions for an example wafer-level assembly method for forming a leadless IC package, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIGS. 1A-E show cross-sectional depictions for an example wafer-level assembly method for forming leadless IC packages, according to an example aspect. Step 101 comprises providing a wafer 180 comprising a substrate 186 having at least a semiconductor surface including a plurality of IC die 150 separated by scribe lines 164, typically hundreds or thousands of such IC die 150. The wafer 180 may comprise a silicon wafer that is 200 mm to 300 mm in diameter. The wafer 180 has completed the front end of the line (FEOL) fabrication (e.g., diffusion, deposition, ion implantation, photolithography and etching) comprising formation of the transistors directly in the semiconductor surface such as a silicon surface, as well as back end of line (BEOL) processing including multilevel metallization.

For conventional semiconductor process flows after BEOL processing there is a "back-end process" (also called post-fab), which is generally not performed in the clean-room, sometimes by a different company, comprising wafer test, then wafer backgrinding, and finally die singulation, followed by assembling singulated IC die on a leadframe. As described below, disclosed methods utilize an unconventional back-end process flow, including backgrinding then molding, then lead terminal forming before IC die singulation.

Each IC die 150 includes circuitry 170 coupled to bond pads 181 with each having bonding features thereon shown for example as pillars 182, which may comprise copper that can be solder capped or can comprise solder bumps. The coupling shown in FIG. 1A and the other FIGs. between a node in the circuitry 170 and the bond pad 181 is depicted by a dashed line. The circuitry 170 comprises circuit elements (including transistors, and generally diodes, resistors, capacitors, etc.) formed in the substrate 186 configured together for generally realizing at least one circuit function. Example circuit functions include analog (e.g., amplifier or power converter), radio frequency (RF), digital, or non-volatile memory functions. One particular substrate 186 example is a silicon epitaxial layer on bulk silicon. FIG. 1A shows a portion of an example wafer 180 showing three IC die 150 separated by scribe lines 164. In disclosed methods, after the multilevel metallization, the wafer 180 is generally background from a thickness of 725 µm (for 200 mm diameter wafers) to 775 µm (for 300 mm diameter wafers) to a thickness of about 50 µm to 375 µm.

Figure 1B:
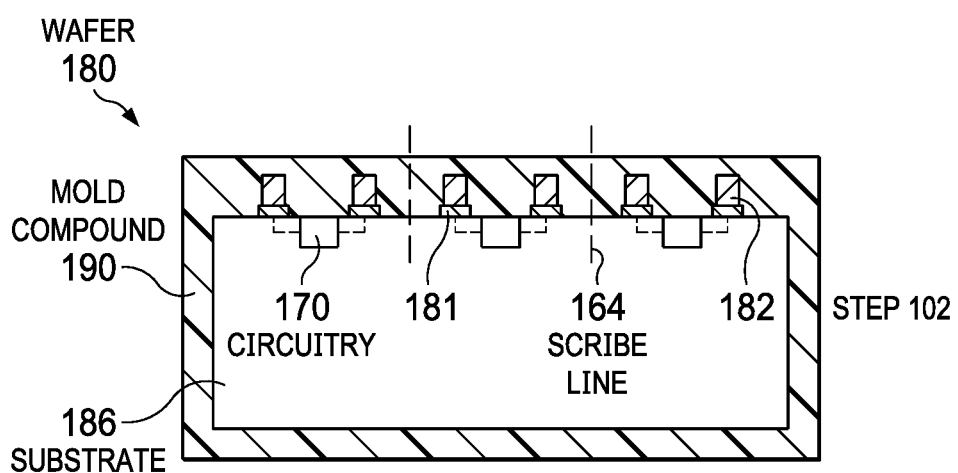

Step 102 comprises forming a mold compound 190 around the wafer 180 including mold compound on both the top and the bottom side of the wafer. One particular molding process comprises compression molding. FIG. 1B shows the wafer 180 after step 102 showing a mold compound 190 on both sides of the wafer 180, as well as on the sidewall surfaces of the wafer 180.

Figure 1C:
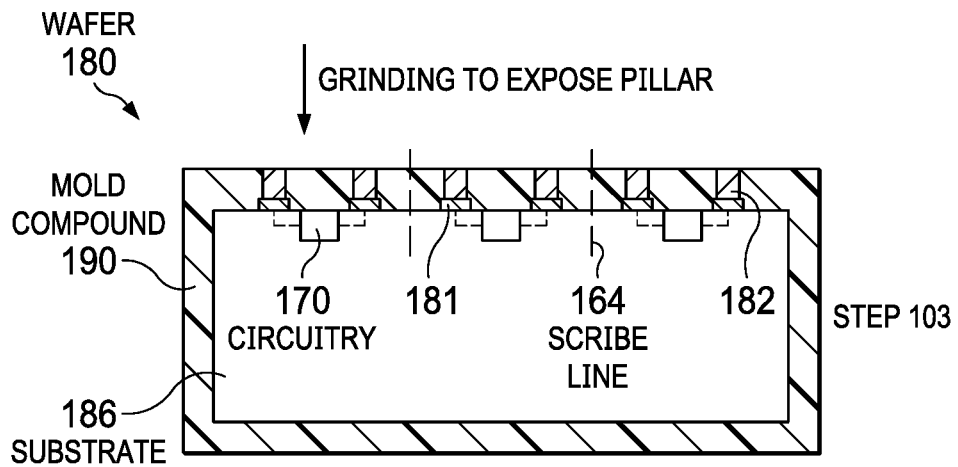

Step 103 comprise removing a portion of the mold compound 190 to expose at least the top surface of the pillars 182 or other bonding features on the bond pads 181. The removing to expose the top surface of the pillars 182 can comprise a grinding process. Other possible mold compound removing processes include laser ablation. The removing in the case of grinding can be performed using a grinding apparatus such a Suhwoo grinding system. FIG. 1C shows the wafer 180 after the partial mold removal step 103. After step 103, the method can optionally further comprise plasma processing to eliminate or at least reduce any oxide material on the surface of the pillars 182 which may comprise copper, and to also roughen the top surface of the wafer 180 to enhance adhesion, such as to improve ink adhesion for the ink printing process described below relative to step 104.

Figure 1D:
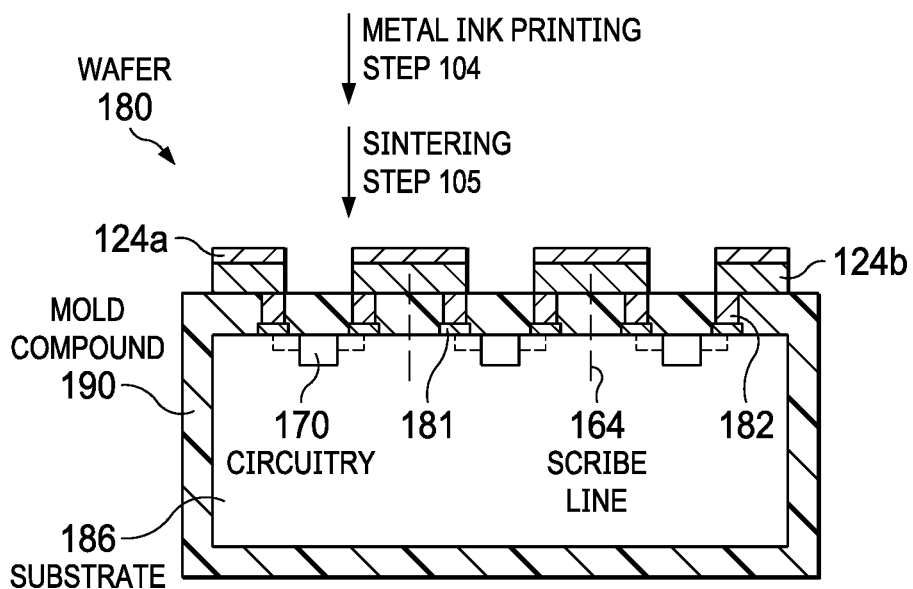

Step 104 comprises printing a metal precursor material pattern over a top surface of the wafer 180 including connecting metal precursor material extending over the scribe lines 164 between adjacent bonding features 182 on opposite sides of the scribe lines 164. FIG. 1D shows a first metal precursor material layer 124a on a second metal precursor material layer 124b, such as a printing a silver ink as the first metal precursor material layer 124a after printing a copper ink as the second metal precursor material layer 124b. Copper ink is relatively cheap, but due to significant oxidation of copper when exposed to air copper generally needs plating for surface mounting; and other inks such as silver and gold inks although being relatively expensive, do not need plating.

Accordingly, if one prints a copper ink as the first metal precursor material layer 124a, then prints a second ink comprising an oxidation resistant material such as a silver or gold ink as the second metal precursor material layer 124b, there will generally be no need for plating while the processing cost will be reduced. One example printing process comprises printing a copper ink using photonic printing process which comprises printing using laser light. For photonic printing, the printing process for the wafer 180 may take <1 second, such as several hundred milliseconds.

The printed portion(s) can be formed by additively depositing (e.g., three-dimensional (3D) printing, i.e., inkjet printing, or screen printing) a metal precursor (e.g., an ink or a paste including a plurality of metal particles) to generally deposit a printed metal precursor. The additively depositing is generally followed by sintering or curing step. A typical thickness for the printed metal precursor is 10 µm to 150 µm. The additively depositing process can comprise a plurality of coating and sintering steps, such as a sequence of powder coating followed by laser exposure steps.

As known in the art of printing an ink, an ink includes a material that is either solid (e.g., particles, such as nanoparticles) or a precursor for a solid that forms a solid (e.g., particles) upon curing or sintering to remove its liquid carrier including a solvent and/or a dispersant. For example, the ink can be a sinterable metal ink or an ultraviolet (UV)-curable polymer or a UV-curable polymer-based mixture. The ink can be additively deposited by a printer platform into its programmed desired locations. The ink deposition apparatus can comprise an inkjet printer that uses piezoelectric, thermal, or acoustics, an electrostatic inkjet printer, or a screen or flexographic printer.

Alternatively to a metal ink one may also generally use a metal paste, such as after being additively deposited by screen printing, which can be processed including a heat up step in a reducing gas atmosphere, and then a vacuum sintering step generally at a temperature of at least 200° C. for forming a sintered metal material. Metal pastes can be conventionally sintered in a cure oven to remove the binder and solvent if they are present, and to densify for reducing the porosity of the metal material.

Figure 2:
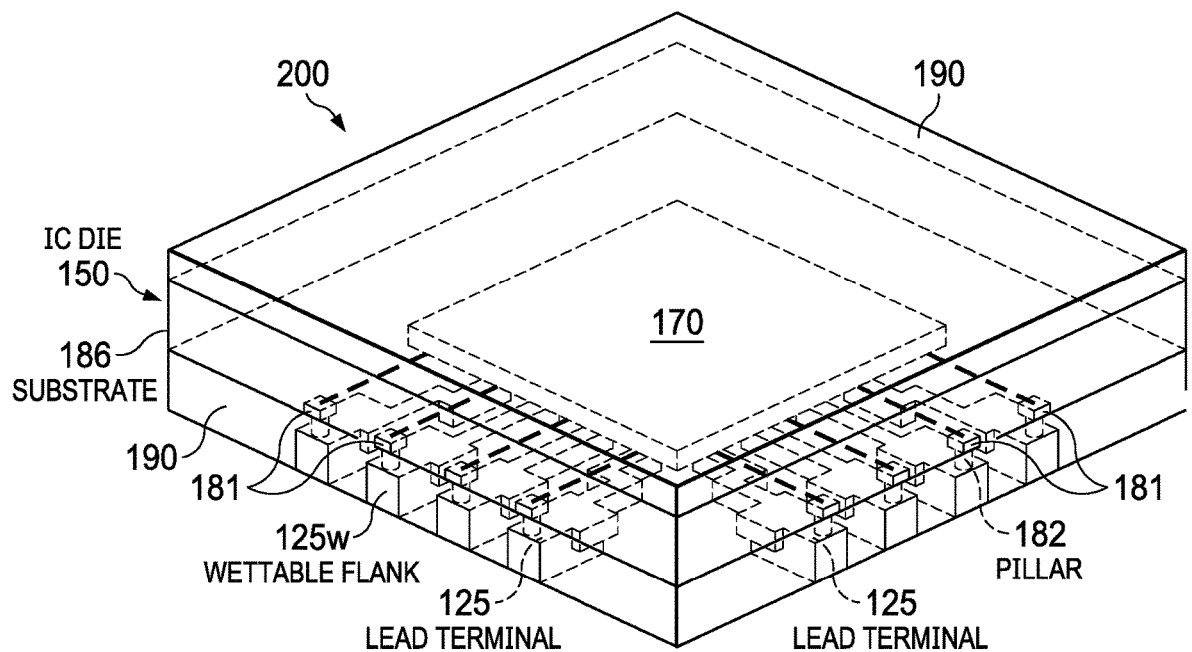
FIG. 2 is a perspective three-dimensional (3D) partial see-through view of an example leadless IC package, according to an example aspect.

Step 105 comprises sintering the metal ink or other metal precursor material, such as by thermal heat and laser (drying; UV curing, other curing) to form lead terminal precursors shown as first and second metal precursor material layers 124a and 124b, that will become lead terminals 125 for a single metal precursor material layer process as shown in FIG. 2 after disclosed package sawing as described below. When first and second metal precursor material layers 124a and 124b are used, such as respective first and second inks, after sintering the resulting layers will mix on both sides of the interface, and thus not be completely separate layers. For example, silver ink will sinter with copper ink at their interface, so that there will be metallurgical bonds between the silver layer and copper layer through inter-diffusion.

Pressure or pressure-less (atmospheric pressure) sintering is a known technology. In one specific arrangement, one can pressure-less sinter copper inks in formic acid. Copper oxides can be reduced to metallic copper in formic acid at an elevated temperature, such as at about 190° C. After sintering, the electrical resistivity of pressure-less sintered copper may be the order of $1\times10^{-5}$ ohm-cm, which can be compared with solder that generally has a resistivity of about $2\times10^{-5}$ ohm-cm. With pressure applied during the sintering of an ink, such as in a pressure range of 1 to 20 MPa, it is expected to achieve and even lower electrical resistivity with increasing pressures.

FIG. 1D shows the wafer 180 after printing a metal precursor material including a metal ink comprising a material that is a solid or a precursor for a solid, then curing or sintering to form a solid material in a pattern of lead terminal precursors 124 that connect between adjacent bonding features 182 on opposite sides of the scribe lines 164. The lead terminals 125 may have a porosity greater than 10%.

Although the lead terminal precursors 124 are shown in FIG. 1D as linear segments, there is no such limitation. For example, see the lead terminals 125 shown in FIG. 2 described below. In the case of the pillars 182 being copper pillars and the lead terminals 125 formed from the lead terminal precursor 124 also being copper, the connection between the pillars 182 and the lead terminals is copper to copper, which will inherently have good electrical and good reliability performance.

Figure 1E:
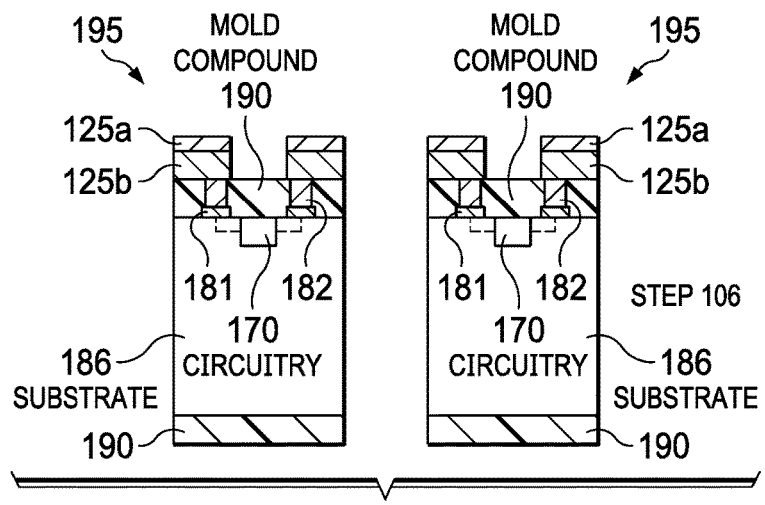

Step 106 comprises sawing over the scribe lines 164 to cut through the lead terminal precursors to form the lead terminals 125, and to saw through the mold compound 190 and the substrate 186 to singulate the wafer shown above as 180 into a plurality of the leadless IC packages, with first and second simplified leadless IC package 195 shown in FIG. 1E. Although not specifically shown in FIG. 1E the IC die 150 shown in FIG. 1A is the leadless IC package 195 minus the mold compound 190 and lead terminals shown as layer 125b on layer 125a, such as a silver or gold layer as layer 125b on a copper layer as layer 125a. Although shown as separate layers in FIG. 1E, some mixing and metallurgic bonding at the interface of layer 125b on layer 125a generally occurs.

As noted above the lead terminal precursors can be formed from a second printing of a oxidation resistant metal such as a noble metal (e.g., silver or gold) after first printing an oxidizable metal such as copper which eliminates the need for plating over oxidizable metal when used for lead terminals, and allows for solder wetting during surface mounting. An actual disclosed leadless IC package may generally have 4 to 156 lead terminals.

FIG. 2 is a perspective 3D partial see-through view of an example leadless IC package shown as 200, being a 16 pin QFN package, according to an example aspect. As before the IC die shown as 150 has circuitry 170 coupled to bond pads 181 that have bonding features shown as pillars 182 thereon. The lead terminals are shown as 125 which can be seen to have an exposed side edge and exposed bottom side. As noted above, although not shown in FIG. 2, the lead terminals 125 can comprise 2 layers (such as shown as layer 125a on layer 125b in FIG. 1E) with an oxidation resistant material layer such as silver or gold on a copper layer. The lead terminals 125 may have a porosity greater than 10%.

The exposed side edge is identified in FIG. 2 as a wettable flank 125w that can be used for solder integrity inspection after assembly to a substrate such as to a PCB. The substrate 186 can be seen extending out to the edge of the leadless IC package 200 which is a distinguishing believed to be unique feature for disclosed leadless IC packages. The substrate 186 extending out the outer edge of the leadless IC package 200 has the advantage of facilitating the direct heat transfer to outside the leadless IC package 200 as substrate materials such as silicon have a much higher thermal conductivity as compared to conventional epoxy-based mold compounds. This can be a particularly significant advantage for high power devices.

The leadless IC package 200 can be relatively thin, such as in the thickness range from 200 µm to 1,000 µm, such as being 200 µm to 600 µm thick, and has a minimum area of about 1.3 mm². As noted above, disclosed aspects eliminate the usage of leadframes which can add a significant expense to an IC package. Moreover, all packaging for disclosed leadless IC packages including molding and forming lead terminals is performed at the wafer level, making disclosed leadless IC packages generally comparatively low cost.

Disclosed aspects can be integrated into a variety of assembly flows to form a variety of different leadless semiconductor IC devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A method of forming a leadless integrated circuit (IC) package, comprising:
   providing a wafer comprising a substrate having at least a semiconductor surface including a plurality of integrated circuit (IC) die separated by scribe lines, each of the IC die including circuitry coupled to bond pads each having bonding features thereon;
   molding to form a mold compound on top and bottom sides of the wafer;
   removing a portion of the mold compound to expose at least a top surface of the bonding features;
   additively depositing at least one printed metal precursor material, wherein the printed metal precursor material comprises an ink comprising a material that is a solid or a precursor for a solid that forms a solid material upon the curing or the sintering over a top surface of the wafer including to connect over the scribe lines between adjacent ones of the bonding features on opposite sides of the scribe lines;
   sintering or curing the printed metal precursor material to form printed metal material, and
   after the sintering or the curing, sawing over the scribe lines to cut through the printed metal material to form lead terminals, through the mold compound, and to cut through the substrate to singulate the wafer into a plurality of the leadless IC packages.

2. The method of claim 1, wherein the removing comprises grinding or laser ablation, further comprising a plasma treatment after the grinding or the laser ablation.

3. The method of claim 1, wherein the sintering or the curing comprises pressure-less sintering.

4. The method of claim 1, wherein the printed metal precursor material comprises at least one ink.

5. The method of claim 1, further comprising backgrinding the wafer before the molding.

6. The method of claim 1, wherein the additively depositing comprises photonic printing, screen printing, stencil printing, or inkjet printing.

7. The method of claim 1, wherein leadless IC package excludes a lead frame.

8. The method of claim 1, wherein the additively depositing the at least one printed metal precursor material comprises first depositing a first metal precursor material that comprises copper and then depositing a second metal precursor material, wherein the second metal precursor material is oxidation resistant as compared to the copper.

9. A method of forming a leadless integrated circuit (IC) package, comprising:
   spacing apart a plurality of lead terminals on at least two sides of the leadless IC package;
   providing an IC die comprising a substrate having at least a semiconductor surface including circuitry coupled to bond pads with the bond pads having bonding features thereon, wherein the bonding features are flip chip bonded to the plurality of lead terminals; and
   molding to form a mold compound above the IC die and between adjacent ones of the lead terminals; and
   wherein the lead terminals and the substrate both extend out to have exposed surfaces at edges of the leadless IC package, and wherein the lead terminals also provide a back side bondable contact.

10. The method of claim 9, wherein the lead terminals comprise a printed metal precursor material including a metal ink comprising a material that is a solid or a precursor for a solid that forms a solid upon curing or sintering.

11. The method of claim 9, wherein the bonding features comprise pillars or solder bumps.

12. The method of claim 9, wherein the leadless IC package comprises a quad flat no leads (QFN) type package.

13. The method of claim 10, wherein the metal ink includes at least one of copper and silver nanoparticles.

14. The method of claim 9, wherein the lead terminals have a porosity greater than 10%.

15. The method of claim 9, wherein the lead terminals comprise a second material on a first material that comprises copper, wherein the second material is oxidation resistant as compared to the copper.

16. The method of claim 10, wherein the leadless IC package comprises a quad flat pack no leads (QFN) package.

17. The method of claim 9, wherein the leadless IC package is 200 µm to 600 µm thick.

18. A method of forming a leadless integrated circuit (IC) package, comprising:
   spacing apart a plurality of lead terminals on at least two sides of the leadless IC package,
   providing an IC die comprising a substrate having at least a semiconductor surface including circuitry coupled to bond pads with the bond pads having copper pillars thereon, wherein the copper pillars are flip chip bonded to the plurality of lead terminals, and
   molding to form a mold compound above the IC die and between adjacent ones of the lead terminals; and
   wherein the lead terminals and the substrate both extend out to have exposed surfaces at edges of the leadless IC package, and wherein the lead terminals also provide a back side bondable contact.

19. The method of claim 18, wherein the lead terminals have a porosity greater than 10%.

20. The method of claim 18, wherein the lead terminals comprise a second material on a first material that comprises copper, and wherein the second material is oxidation resistant as compared to the copper.

* * * * *